(12) United States Patent
Lai et al.

(10) Patent No.: US 7,570,569 B2
(45) Date of Patent: Aug. 4, 2009

(54) POWER CONTROL METHOD OF OPTICAL DISK DRIVE

(75) Inventors: Ronnie Lai, Taipei (TW); Ronald Chen, Taipei (TW)

(73) Assignee: Via Technologies, Inc., Shindian, Taipei (TW)

( * ) Notice: Subject to any disclaimer, the term of this patent is extended or adjusted under 35 U.S.C. 154(b) by 613 days.

(21) Appl. No.: 11/339,718

(22) Filed: Jan. 26, 2006

(65) Prior Publication Data

US 2006/0164900 A1 Jul. 27, 2006

Related U.S. Application Data

(60) Provisional application No. 60/646,632, filed on Jan. 26, 2005.

(51) Int. Cl.
*G11B 7/00* (2006.01)
(52) U.S. Cl. ..................................... 369/116
(58) Field of Classification Search ................ 369/116, 369/120, 121, 47.5, 47.51, 47.52, 47.53, 369/47.54
See application file for complete search history.

(56) References Cited

U.S. PATENT DOCUMENTS 6,671,248 B2 * 12/2003 Miyabata et al. ............ 369/116
7,280,446 B2 * 10/2007 Suzuki et al. ............ 369/44.29

* cited by examiner

*Primary Examiner*—Nabil Z Hindi
(74) *Attorney, Agent, or Firm*—Bacon & Thomas, PLLC

(57) ABSTRACT

A power control method is provided for an optical disk drive. The optical disk drive has an optical read/write module for accessing an optical storage media. The power control method includes the following steps: measuring the temperature of the optical read/write module; predicting a threshold current of the optical read/write module according to the temperature; determine the accessing mode of the optical storage media; measuring the output power of the optical read/write module; computing a first current required for the optical read/write module according to the output power of the optical read/write module and a base power in the accessing mode; compensating the computed first current according to the predicted threshold current; and driving the optical read/write module according to the first current.

13 Claims, 17 Drawing Sheets

POWER CONTROL METHOD OF OPTICAL DISK DRIVE

BACKGROUND OF THE INVENTION

1. Field of Invention

The application relates to a power control method, and, in particular, to a power control method of an optical disk drive.

2. Related Art

An electric device is sensitive to temperature such that the performance and accurate of the electric device may be affected by surrounding temperature the electric device locates. In order to control the electric device at different temperatures, a proper control module must be designed to modify the affection resulted from the thermal factor.

Referring to FIG. 1, when the temperature of the optical pickup head is at a temperature $T_1$, the output power and the operating current of the optical pickup head are related in a line $L_1$. In other words, the optical pickup head generates the output power at power $P_b$, $P_e$, and $P_w$ if the operating current is respectively equal to current $I_b$, $I_e$, and $I_w$.

If the temperature of the optical pickup head rises to a temperature $T_2$, the conventional technique determines if the optical pickup head correctly generates the output power according to a power feedback signal generated by the optical pickup head. In other words, the conventional technique set the power $P_e$ as a base power and determines if the output power of the optical pickup head is equal to the power $P_e$ according to the power feedback signal. At the same time, because the optical pickup head is effected by temperature, the optical pickup head only generates the output power at power $P_e'$ if it is driven by the operating current equal to the current $I_e$. Thus the conventional technique adjusts the operating current until the optical pickup head generates the output power at power $P_e$ (as the dotted line A) in the method of close loop feedback control.

However, in order to control the optical pickup head to generate the output power at different powers, the conventional technique computes the operating current driving the optical pickup head to generate other powers according to the current $I_e$, power $P_e$, power $P_e'$ and the other powers. For example, if the optical pickup head is controlled to generate the output power at the power $P_w$, the conventional technique computes the current $I_w'$ resulting in the power $P_w$ according to the current $I_e$, power $P_e$, and the relationship between the power $P_w$ and the power $P_e'$. Similarly, the current $I_b'$ resulting in the power $P_b$ is also computed. Thus, the operating current, which drives the optical pickup head to generate the specific output power, is computed at the temperature $T_2$ in the same way. In other words, the conventional technique computes the operating current resulting in the specific output power at the temperature $T_2$ according to the relationship between the different powers in the line $L_1$ or line $L_2$.

However, when the temperature of the optical pickup head actually reaches the temperature $T_2$, the output power and the operating current of the optical pickup head are not related in the line $L_2$ but a line $L_3$. Regarding to the above example, the operating current computed according to the conventional technique is the current $I_s'$, and the current $I_s'$ drives the optical pickup head to generates the error output power at power $P_w'$ (as the dotted line B) and power $P_b'$ (as the dotted line C), which are not correctly controlled at power $P_w$ and $P_b$. The errors in the above cases are caused by that the conventional technology ignores the threshold current (the intersection of the line $L_1$ and the current axis or the intersection of the line $L_2$ and the current axis). Referring to FIG. 2, the temperature and the threshold current of the optical pickup head are related in an exponential relationship. When the temperature of the optical pickup head raises, the threshold current of the optical pickup head also raises. If the temperature and the threshold current are insufficient, the operating current computed by the conventional technology for obtaining the output power at different temperatures would not have an obvious error. However, if the temperature and the threshold current are sufficient or the output power is to be precisely controlled, the error of the operating current computed by the conventional technique is inevitable. For this reason, the output power of the optical pickup head suffering from temperature changes can not be correctly modified when the operating current of the optical pickup head is only computed based on the power feedback signal and without considering the threshold current of the optical pickup head.

In addition, referring to FIG. 3, the conventional optical pickup head generates the output power in rewriting mode. Because an erasing power $P_e$ is set as a base power, the output power $P_{out}$ of the optical pickup head is precisely controlled at the erasing power $P_e$. However, resulting from ignoring the threshold current, the other output power $P_{out}$ computed based on the base power $P_e$ are not precisely controlled at the bias power $P_b$ and the writing power $P_w$ in the rewriting mode. Furthermore, the output power $P_{out}$ is away from the bias power $P_b$ and the writing power $P_w$ more (as the dotted line in FIG. 3).

Similarly, referring FIG. 4 to FIG. 6, the conventional optical pickup head generates the output power $P_{out}$ in a multi pulse writing mode, a castle writing mode, and a block writing mode in the same method described above. In the FIG. 4, because a bias power $P_b$ is set as a base power, the output power $P_{out}$ is precisely controlled at the bias power $P_b$ but not at the writing power $P_w$ (as the dotted line) In the FIG. 5 and FIG. 6, because a bias power $P_b$ and a writing power $P_w$ can set as a base power in the castle writing mode and the block writing mode, the output power $P_{out}$ is precisely controlled at the bias power $P_b$ and the writing power $P_w$, but not at a writing power $P_s$ and a cooling power $P_c$ (as the dotted line). No matter the optical pickup head is in what access mode, ignoring the threshold current causes that the output power $P_{out}$ is not precisely controlled. Therefore, the optical pickup head does not correctly access the optical disk, and, even more, the lifetime of the optical pickup head and the endurance of the optical disk drive are reduced.

It is therefore a subject of the invention to provide a power control method for an optical disk drive, which considers a temperature of an optical pickup head and an accessing mode of an optical disk to control the optical pickup head to generate the output power correctly at different temperature and in distinct accessing mode.

SUMMARY OF THE INVENTION

In view of the foregoing, the invention is to provide a power control method of an optical disk drive, which is able to control an optical read/write module to generate the correct output power at different temperature and accessing mode.

To achieve the above, a power control method is provided for an optical disk drive. The optical disk drive has an optical read/write module for accessing an optical storage media. The power control method includes the following steps: measuring the temperature of the optical read/write module; predicting a threshold current of the optical read/write module according to the temperature; determine the accessing mode of the optical storage media; measuring the output power of the optical read/write module; computing a first current required for the optical read/write module according to the output power of the optical read/write module and a base power in the accessing mode; compensating the computed first current according to the predicted threshold current; and driving the optical read/write module according to the first current.

As mentioned above, the power control method of an optical disk drive of the invention computes an required current, which drives the optical read/write module to generate the distinct output power, according to a temperature of the optical read/write module. Thus, the method according to the invention is different from the conventional method that computes the required current for driving the optical read/write according to the power feedback signal. In addition, the power control method of an optical disk drive of the invention also computes the required current according to an accessing mode of the optical storage media. Therefore, the operating current of the optical read/write module is correctly controlled at different temperatures to generate the output power in distinct accessing mode.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The invention will be described below with reference to relevant drawings, wherein the same elements are referred with the same reference numbers.

Figure 7:
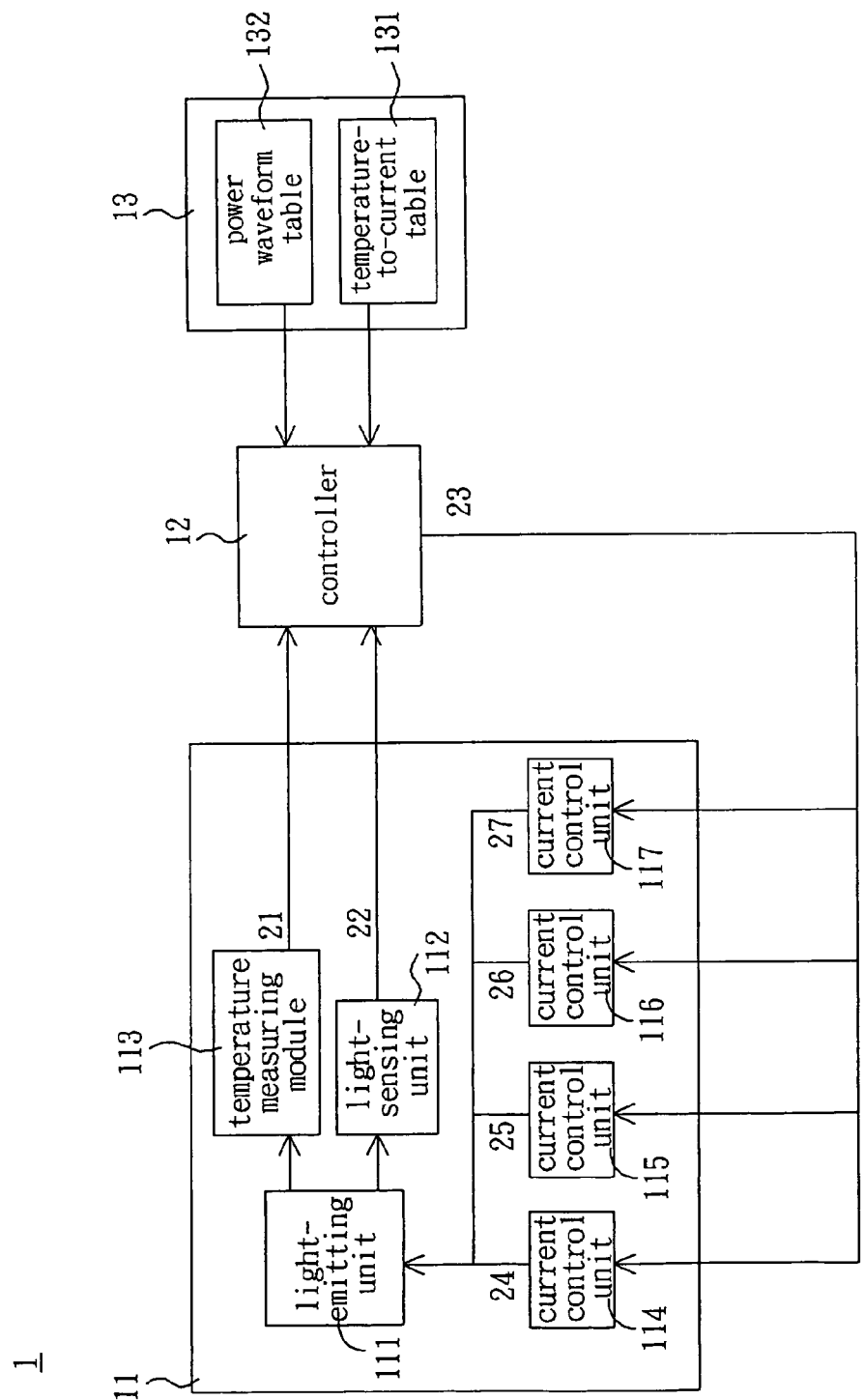
FIG. 7 is a block diagram showing an optical disk drive which the power control method according to a preferred embodiment of the invention is applied.

Referring to FIG. 7, a power control method is provided for an optical disk drive 1. The optical disk drive includes an optical read/write module 11, a controller 12 and a memory 13. The optical read/write module 11 is controlled by the controller 12 to access an optical storage medium.

The optical read/write module 11 includes a light-emitting unit 111, a light-sensing unit 112, a temperature measuring unit 113, and digital-to-analog converting (DAC) units 114-117.

The DAC units 114-117 receive a power control signal 23 to generate currents 24-27 respectively. Then the light-emitting unit 111 is driven by the currents 24-27 to generate an output power.

Figure 1:
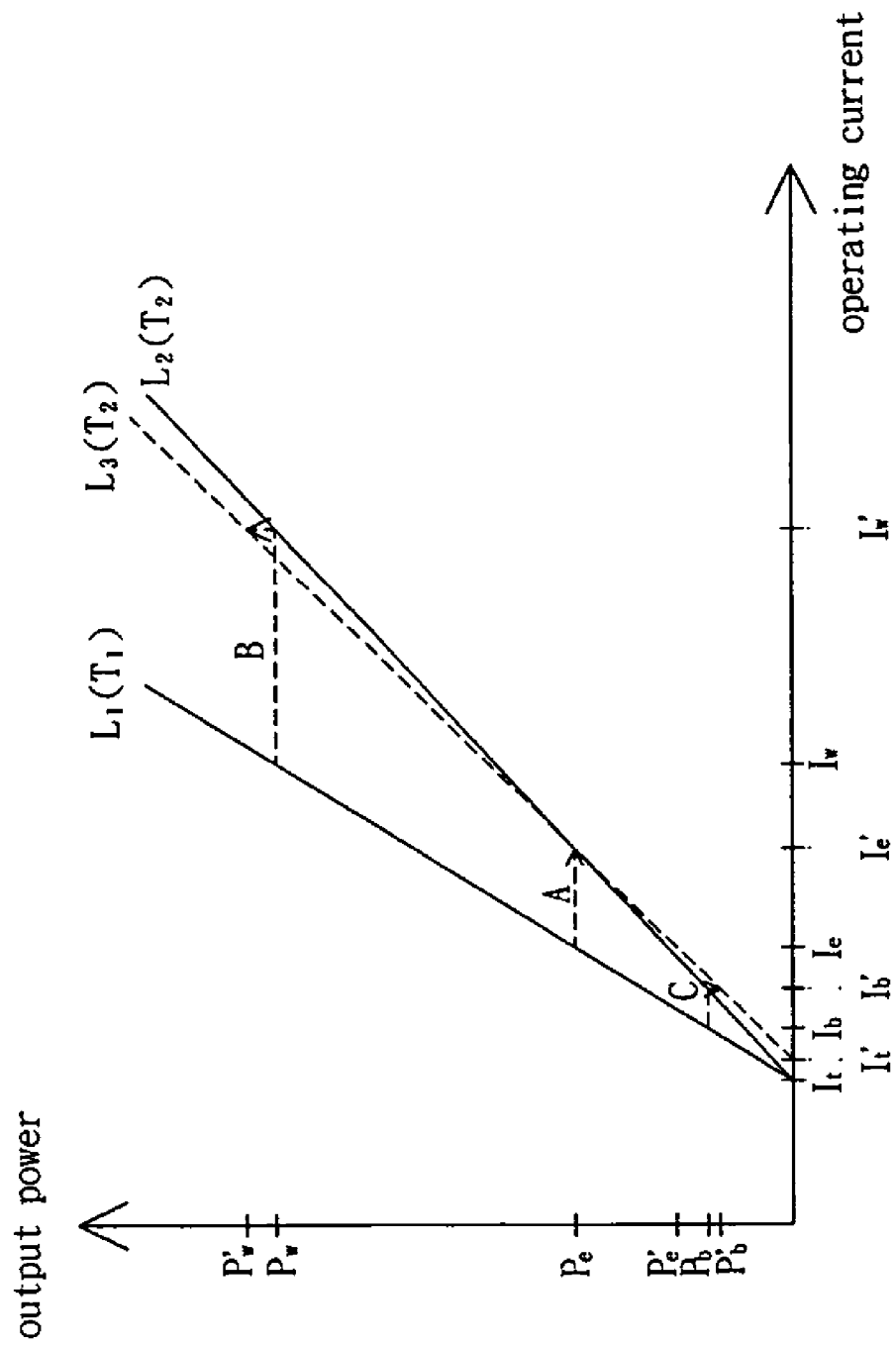
FIG. 1 is a curve relation diagram showing the output power and the operating current of the conventional light-emitting unit.
Figure 2:
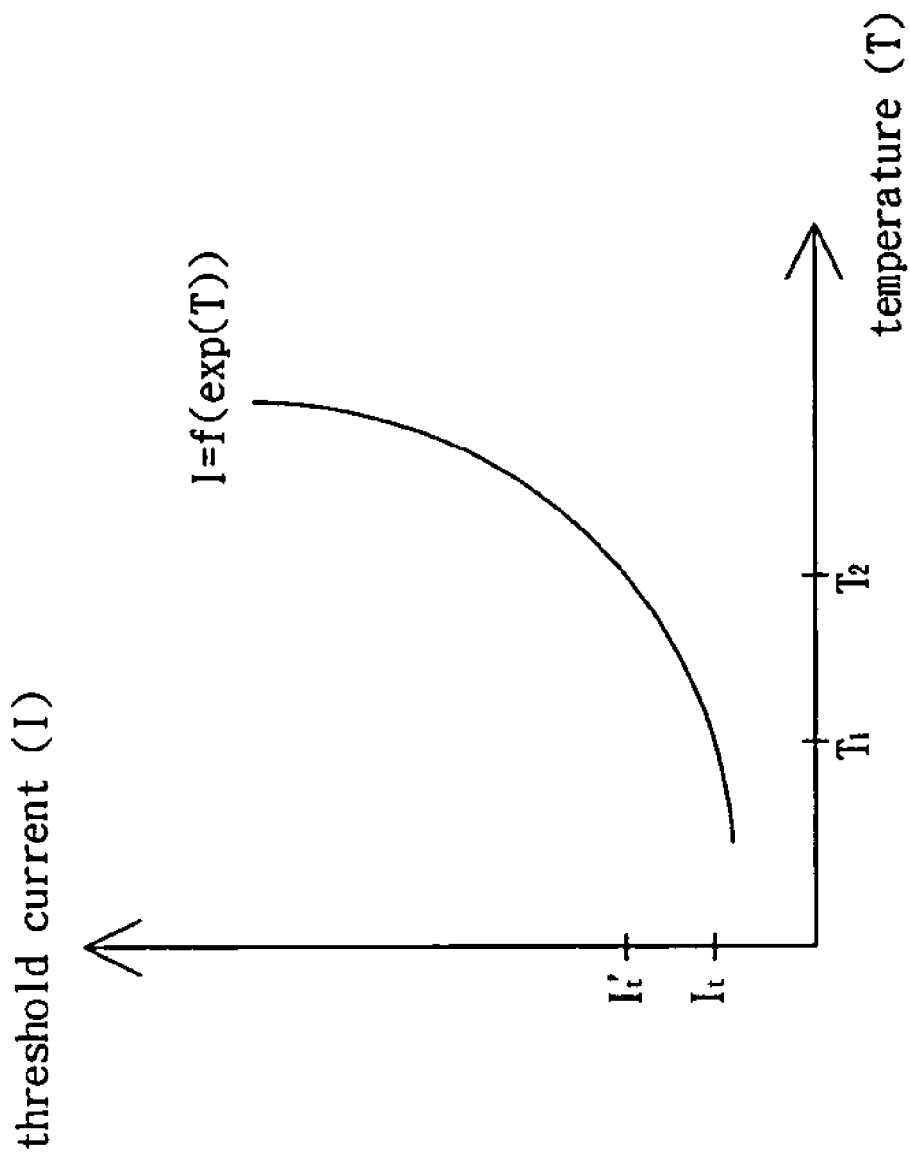
FIG. 2 is a curve relation diagram showing the temperature and the threshold current of the conventional light-emitting unit.
Figure 3:
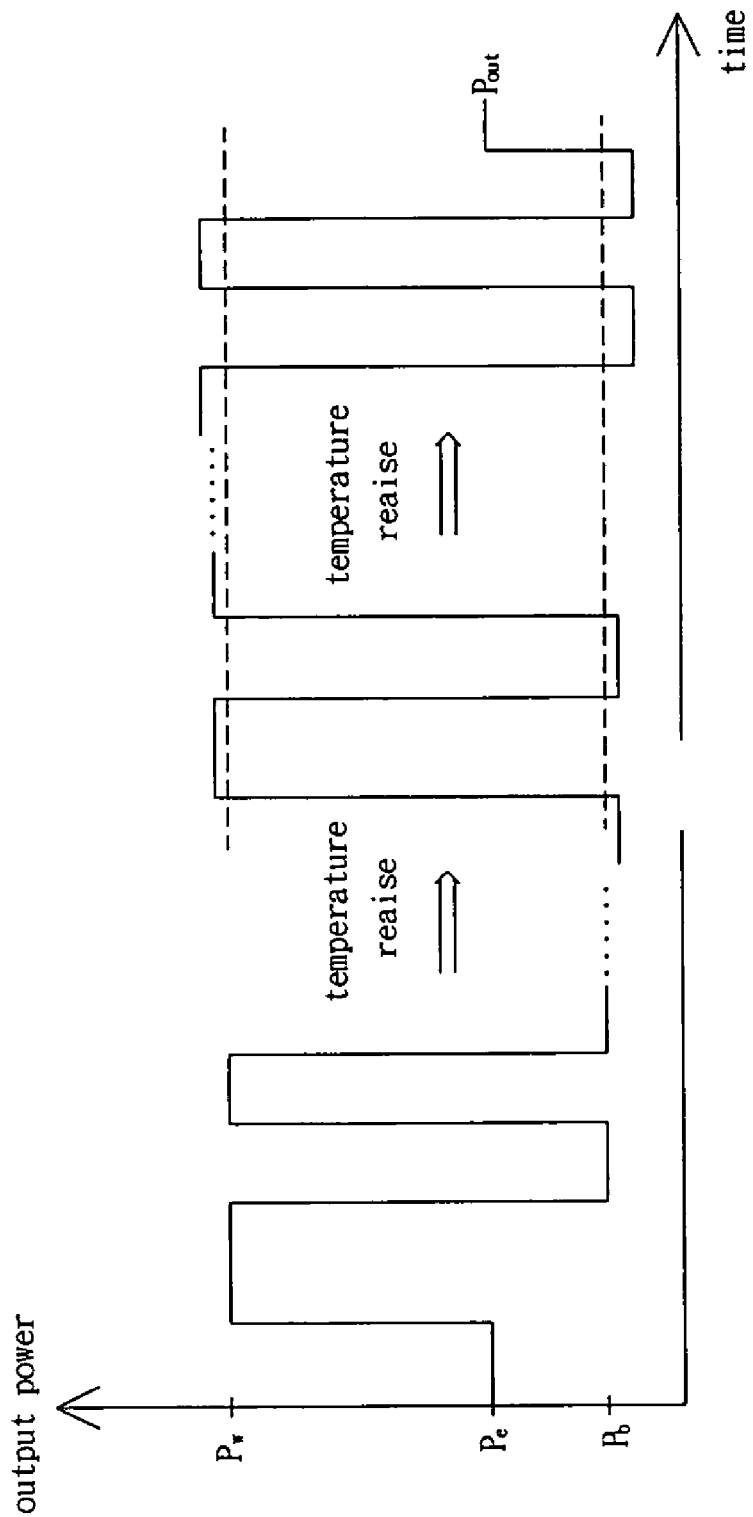
FIG. 3 is a schematic view showing the conventional light-emitting unit generates the output power in the rewriting mode.
Figure 4:
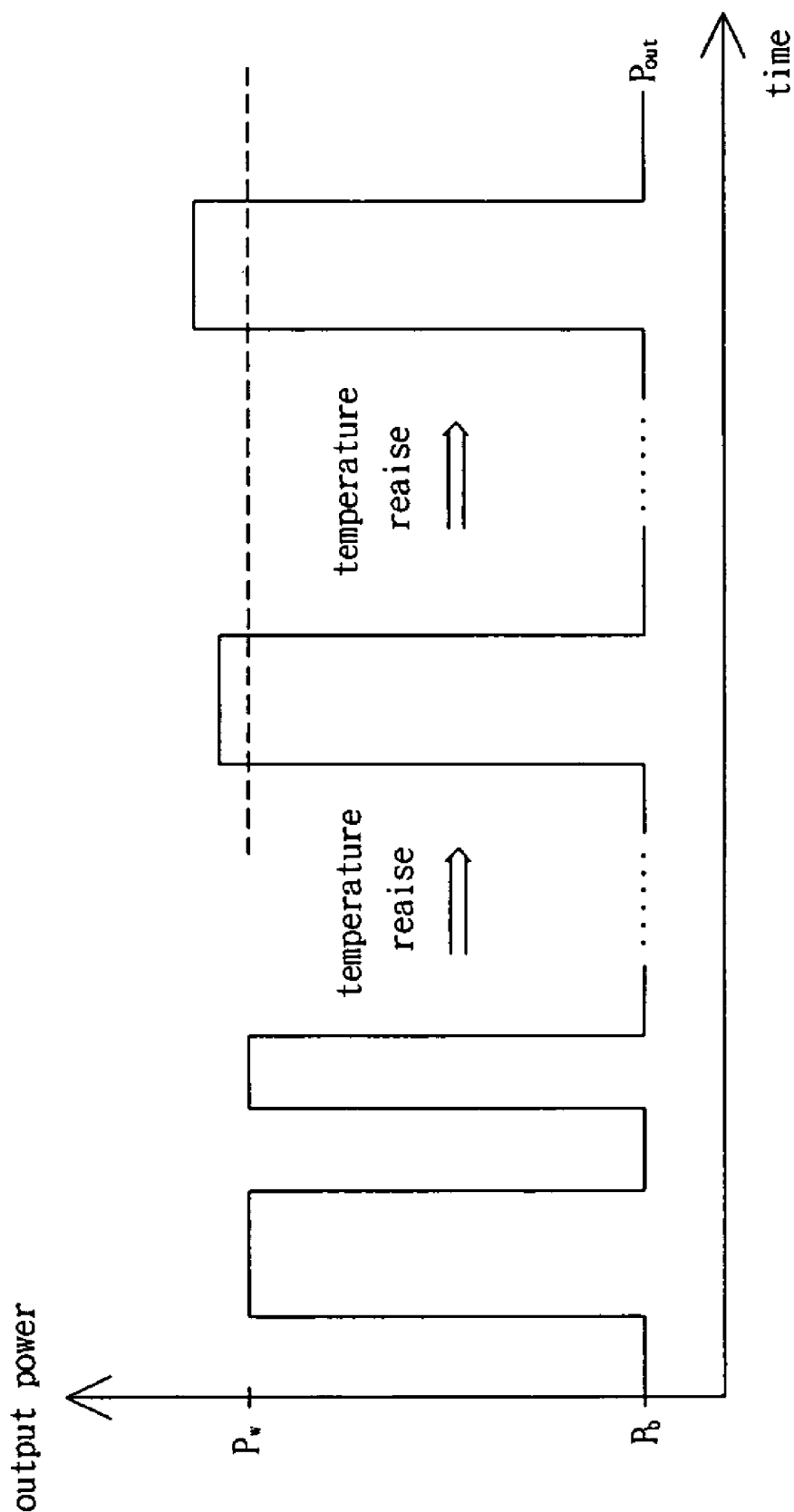
FIG. 4 is a schematic view showing the conventional light-emitting unit generates the output power in the multi pulse writing mode.
Figure 5:
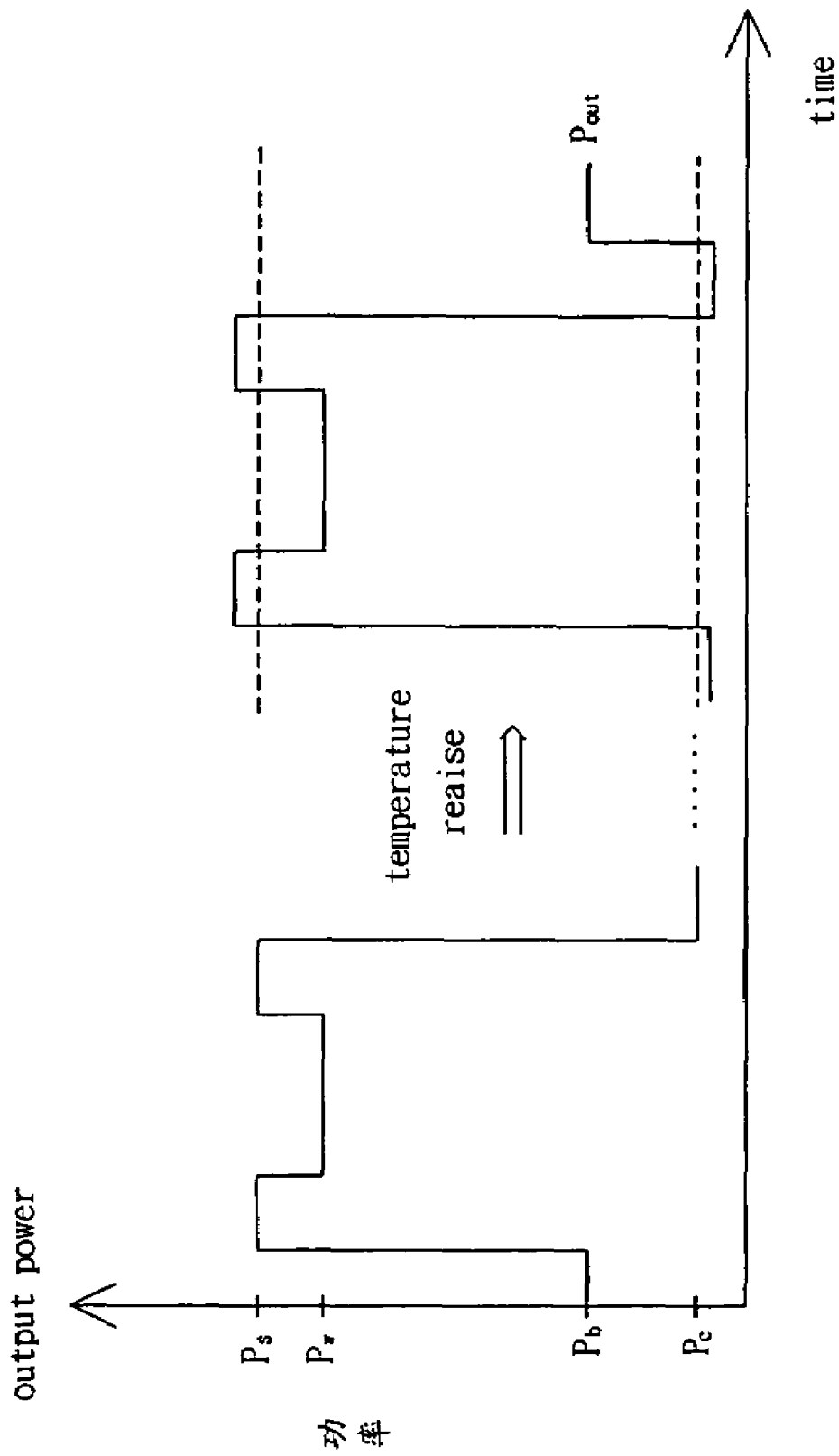
FIG. 5 is a schematic view showing the conventional light-emitting unit generates the output power in the castle writing mode.
Figure 6:
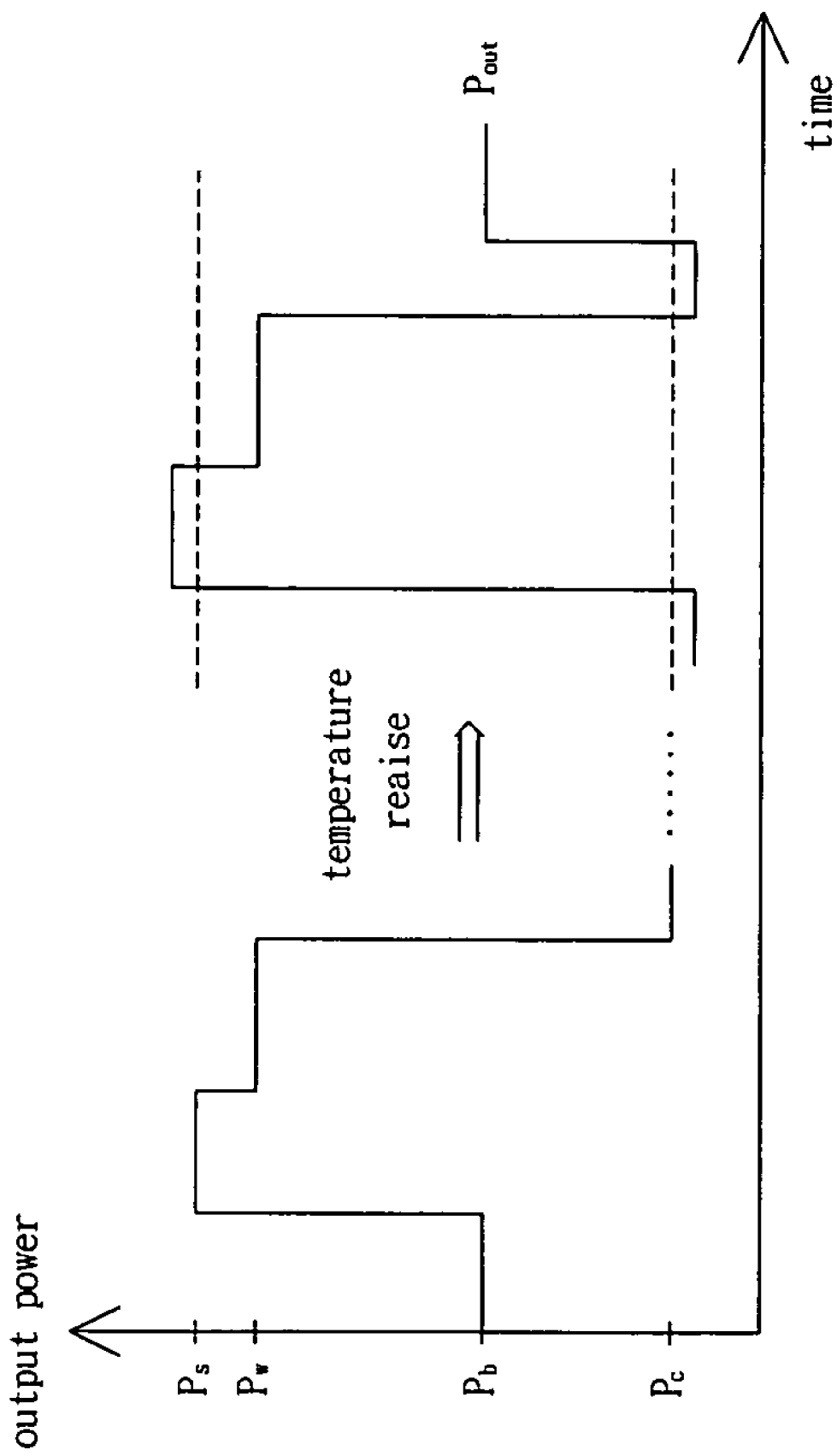
FIG. 6 is a schematic view showing the conventional light-emitting unit generates the output power in the block writing mode.

In this embodiment, the light-emitting unit 111 is generally implemented with a laser diode, therefore the temperature and the threshold current of the light-emitting unit 111 are related in an exponential relationship as shown if FIG. 2. When the temperature of the light-emitting unit 111 increases, the threshold current of the light-emitting unit 111 also increases. Thus an operating current driving the light-emitting unit 111 to light must be larger.

Figure 8:
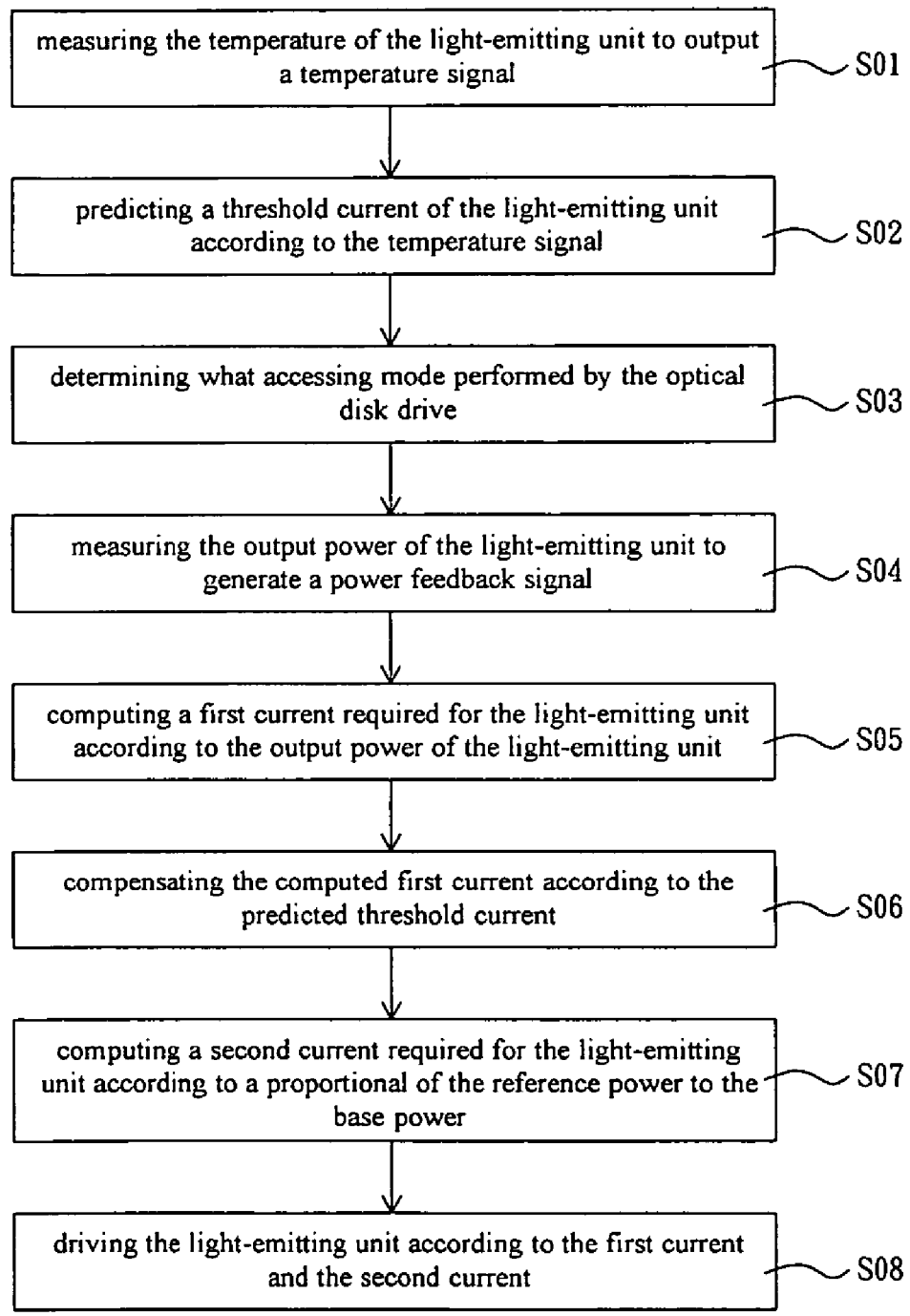
FIG. 8 is a flow chart showing the power control method according to the preferred embodiment of the invention.

Please refer to FIG. 7 and FIG. 8, the power control method includes steps S01 to S08.

In the step S01, the temperature measuring unit 113 measures the temperature of the light-emitting unit 111 to output a temperature signal 21.

Then in the step S02, the controller 12 receives the temperature signal 21 to predict a threshold current of the light-emitting unit 111 according to the temperature signal 21.

In the step S03, the controller 12 determines what accessing mode is performed by the optical disk drive 1 on the optical storage media.

In the step S04, light-sensing unit 112 measures the output power of the light-emitting unit 111 to generate a power feedback signal 22.

In the step S05, the controller 12 reads a base power and a reference power of the accessing mode to compute a first current required for the light-emitting unit 111 according to the output power of the light-emitting unit 111 and the base power of the accessing mode. For example, the controller 12 may read the base power and the reference power of the accessing mode from a power waveform table stored in the memory 13.

In the step S06, the controller 12 compensates the computed first current according to the predicted threshold current, and compute a second current required for the light-emitting unit 111 to generate the reference power according to a proportional of the reference power to the base power in the step S07.

In the step S08, the controller 12 outputs the power control signal 23 according to the second current and the compensated first current. The DAC units 114-117 receive the power control signal 23 and generate the currents 24-27 to drive light-emitting unit 111 according to the power control signal 23.

Besides, the controller 12 predicts the threshold current according to the temperature and the function relationship of the light-emitting unit 111. For convenience, the memory 13 saves a temperature-to-current table 132. The temperature-to-current table 132 records corresponds threshold currents of the light-emitting unit 111 at various temperatures. Therefore, the controller 12 can look the threshold current up in the temperature-to-current table 132 according to the temperature signal 21.

In addition, the power waveform table 131 records settings about base power and reference power in various accessing mode like a reading mode, a rewriting mode, a multi pulse writing mode, a castle writing mode, and a block writing mode. The controller 12 controls the current driving the light-emitting unit 111 and the output power of the light-emitting unit 111.

Figure 9:
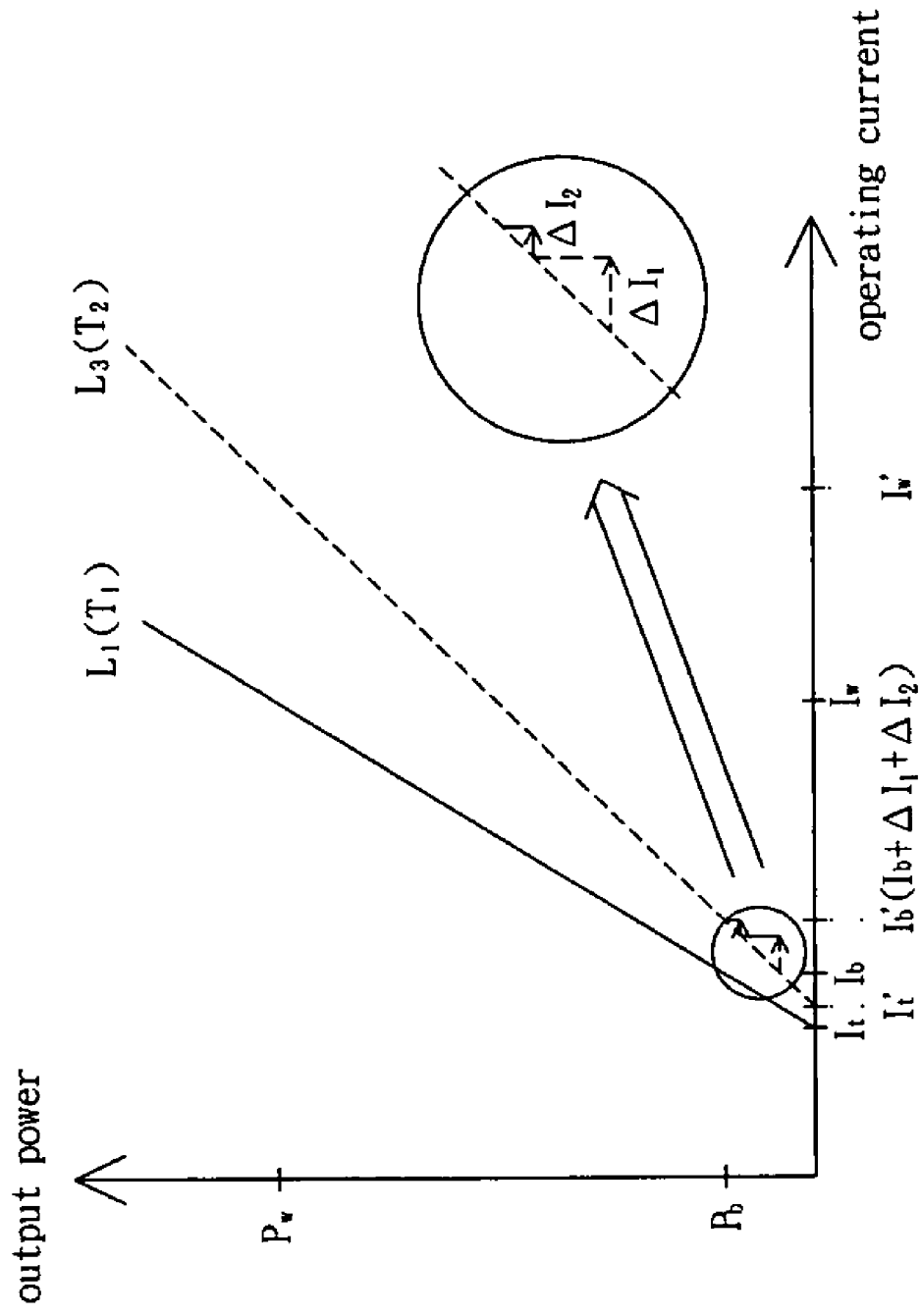
FIG. 9 is a curve relation diagram showing the light-emitting unit of the power control method generates the output power in the multi pulse writing mode according to the preferred embodiment of the invention.

When the temperature of the light-emitting unit 111 is at temperature $T_1$, the output power and the operating current of the light-emitting unit 111 are related in lines $L_1$ as shown in FIG. 9. Therefore the DAC units 114 and 115 are controlled to generate the currents 24, 25 as current $I_b$ and $I_w - I_b$. Thus, the light-emitting unit 111 is driven by the combinations of the currents 45, 46 to generate different output powers (ex: $P_b$ and $P_w$).

Figure 10:
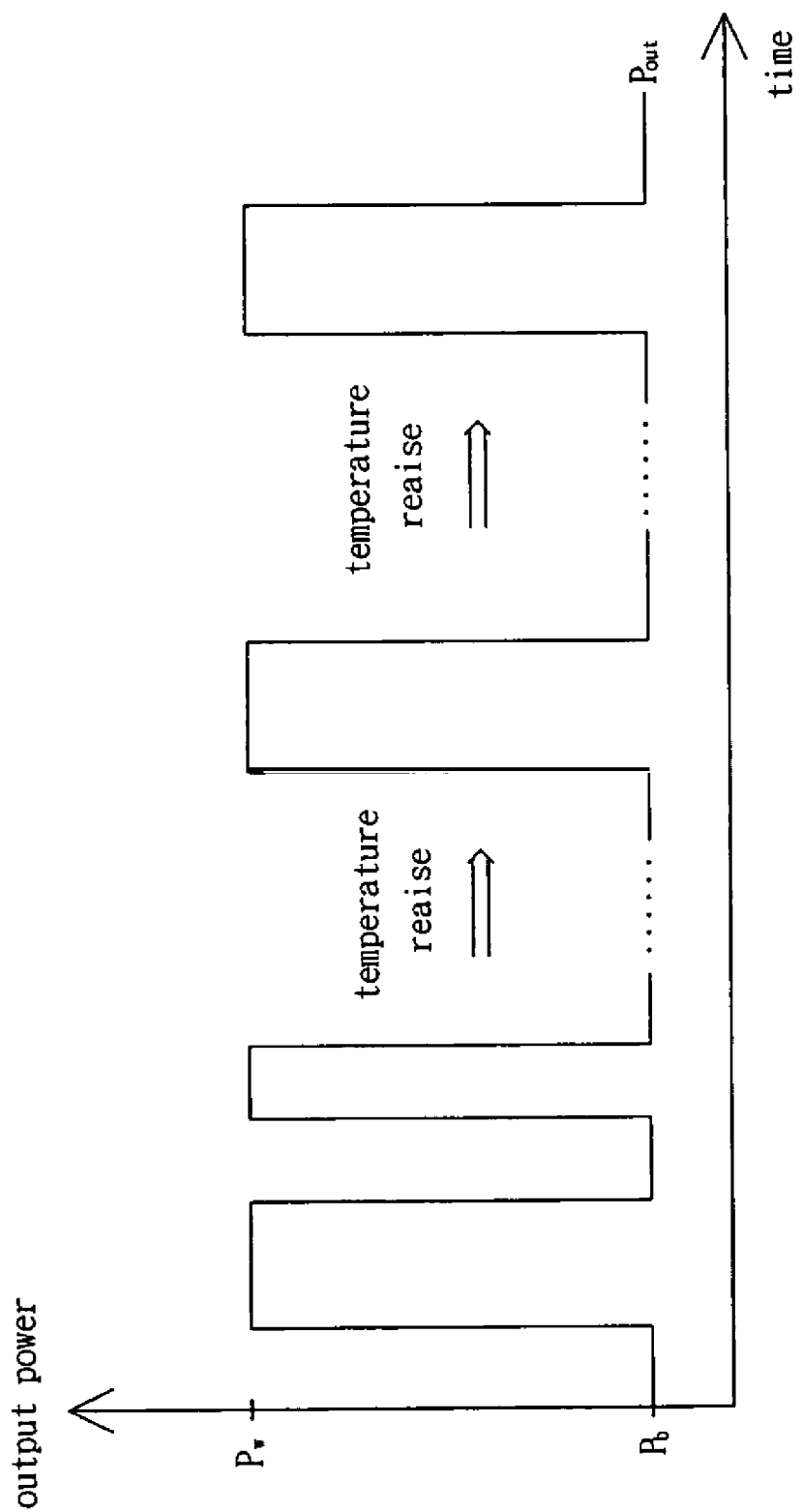
FIG. 10 is a schematic view showing the light-emitting unit of the power control method generates the output power in the multi pulse writing mode according to the preferred embodiment of the invention.

When the temperature of the light-emitting unit 111 raises to the temperature $T_2$, the output power and the operating current of the light-emitting unit 111 are related in lines $L_3$. With applying the steps of the S01 to S08, the controller 12 looks up the threshold current ($I_t'$) and determines the current accessing mode is multi pulse writing mode. Then the controller 12 reads the settings about the base power and the reference power for the multi pulse writing mode from the power waveform table 131. The base power and the reference power are established according to a bias power ($P_b$) and a writing power ($P_w$) in the multi pulse writing mode. This writing mode is shown in FIG. 10 and set up based on the demand for the output power of the optical read/write module in the specification (ex: DVD+R, DVD-R or other optical disk specification).

The controller 12 computes the required operating current ($\Delta I_1$), which drives the light-emitting unit 111 to generate power ($P_b$), according to the base power ($P_b$) and the power feedback signal 22 in the way of a close loop feedback control. Then the controller 12 compare the required operating current ($\Delta I_1$) and the difference of the threshold current ($I_t' - I_t$) for compensating the threshold current first. The controller 12 computes a first current and a second current as shown in formula (1) and (2).

$$I_{1(new)} = (I_{req} - I_{thrs}) \times \frac{P_b}{P_b} + I_{thrs} + I_{1(old)} \quad (1)$$
$$= (\Delta I_1 - I_t') \times \frac{P_b}{P_b} + I_t' + I_b$$

$$I_{2(new)} = (I_{req} - I_{thrs}) \times \frac{P_w - P_b}{P_b} + I_{2(old)} \quad (2)$$
$$= (\Delta I_1 - I_t') \times \frac{P_w - P_b}{P_b} + (I_w - I_b)$$

$I_{1(old)}$: the previous first current
$I_{1(new)}$: the update first current
$I_{2(old)}$: the previous second current
$I_{2(new)}$: the update second current
$I_{thrs}$: the threshold current
$I_{req}$: the required operating current Then the controller 12 generates the power control signal 23 again according to the second current and the compensated first current. The DAC units 114 and 115 receive the power control signal 23 and generate the currents 24 and 25 to drive the light-emitting unit 111. At this moment, the light-sensing unit 112 measures the output power of the light-emitting unit 111 to generate the power feedback signal 22. The controller 12 computes the required operating current ($\Delta I_2$) again according to the base power ($P_b$) and the power feedback signal 22 in the way of a close loop feedback control. Because the temperature of the light-emitting unit 111 does not change, the controller 12 does not need to compensate the threshold current of the light-emitting unit 111. The controller 12 updates the first current and the second current as formula (3) and (4).

$$I_{1(new)} = I_{req} \times \frac{P_b}{P_b} + I_{1(old)} \quad (3)$$
$$= \Delta I_2 \times \frac{P_b}{P_b} + \left((\Delta I_1 - I_t') \times \frac{P_b}{P_b} + I_t' + I_b\right) = I_b'$$

$$I_{2(new)} = I_{req} \times \frac{P_w - P_b}{P_b} + I_{2(old)} \quad (4)$$
$$= \Delta I_2 \times \frac{P_w - P_b}{P_b} + \left(\frac{(\Delta I_1' - I_t') \times}{P_b} \frac{P_w - P_b}{P_b} + (I_w + I_b)\right)$$
$$= (\Delta I_1 + \Delta I_2 - I_t) \times \frac{P_w - P_b}{P_b} + (I_w - I_b) = I_w'$$

Then the controller 12 generates the power control signal 23 again according to the second current ($I_w' - I_b'$) and the compensated first current ($I_b'$). The DAC units 114 and 115 receive the power control signal 23 and generate the currents 24 ($I_b'$) and 25 ($I_w' - I_b'$) to drive the light-emitting unit 111. Therefore the currents 24 and 25 drive the light-emitting unit 111 to generate the output power $P_b$ and $P_w$. In conclusion, when the temperature of the light-emitting unit 111 raise and control by the above method, the output power $P_{out}$ of the light-emitting unit 111 is controlled precisely at the bias power $P_b$ and the writing power $P_w$ in the multi pulse writing mode as shown in FIG. 10.

Figure 11:
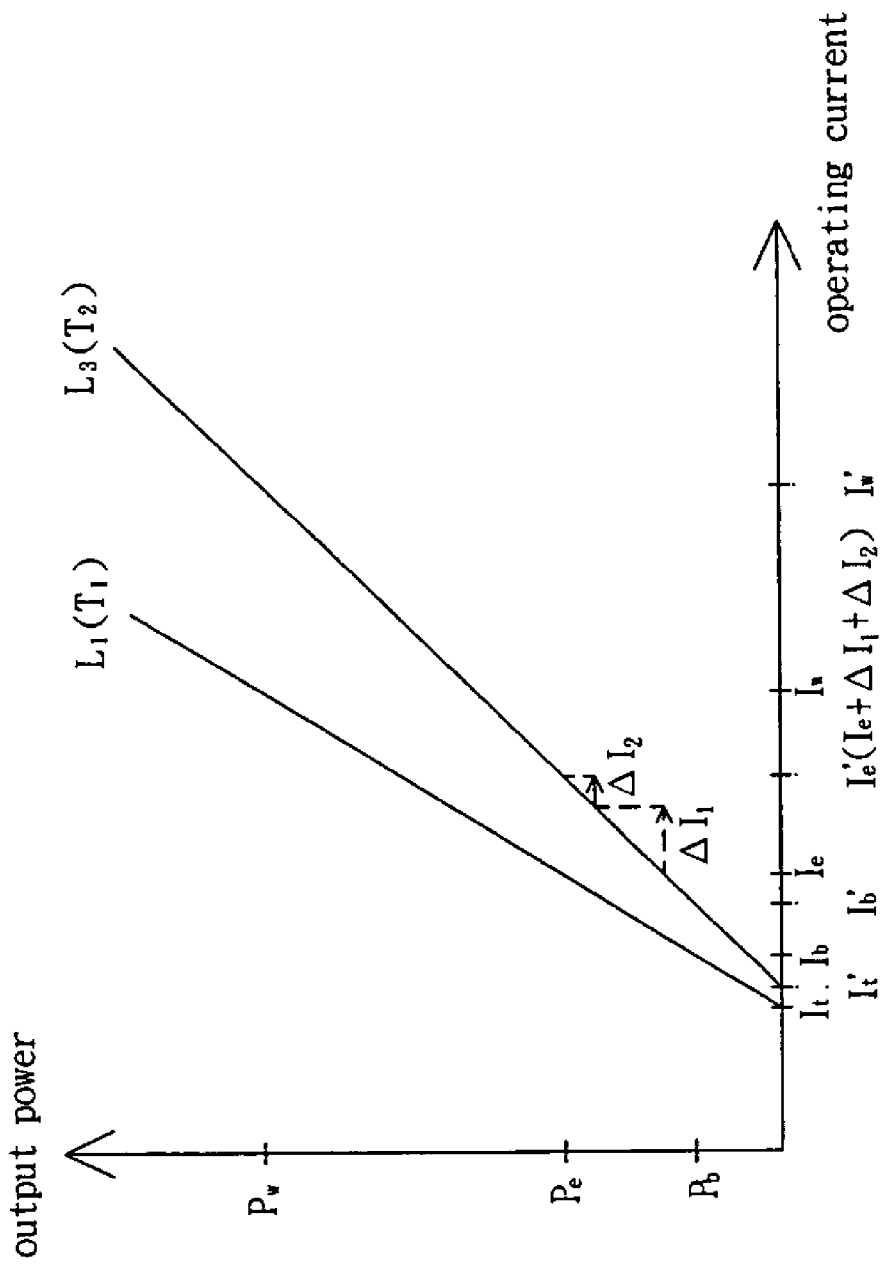
FIG. 11 is a curve relation diagram showing the light-emitting unit of the power control method generates the output power in the rewriting mode according to the preferred embodiment of the invention.
Figure 12:
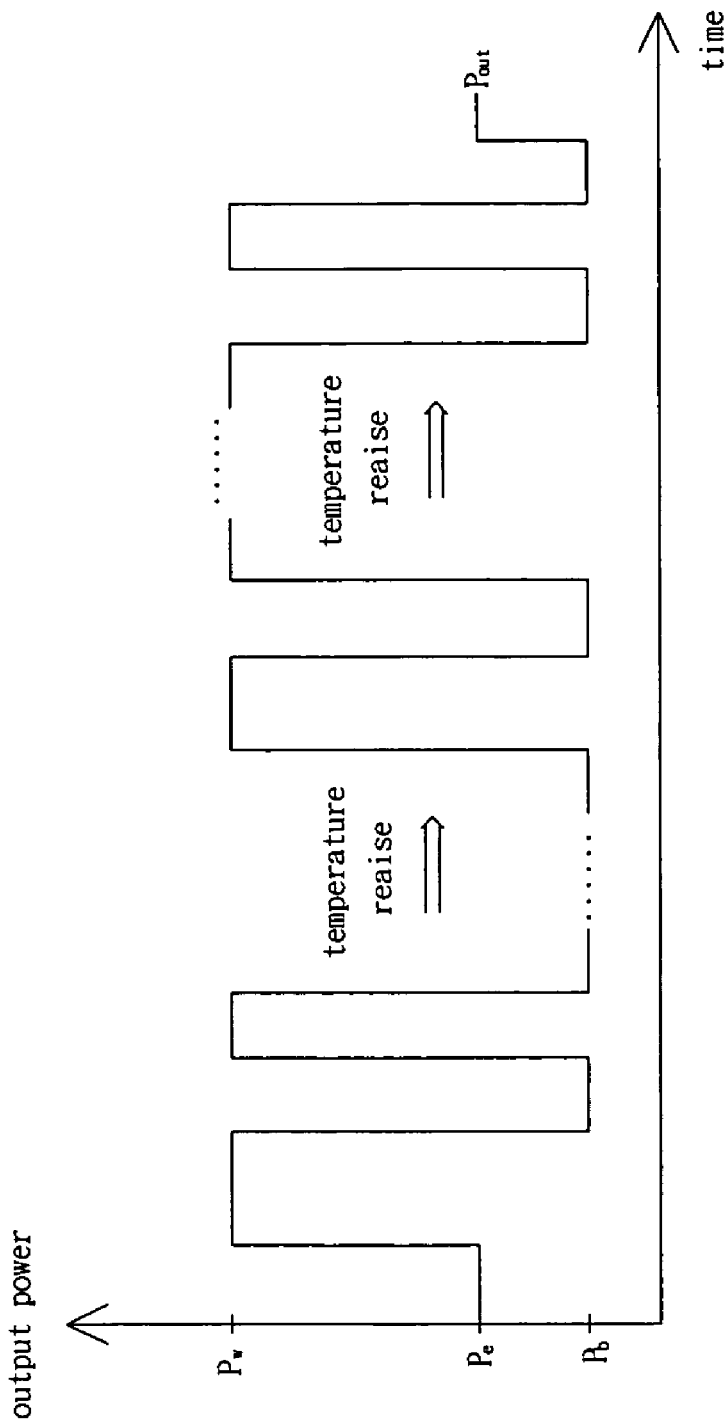
FIG. 12 is a schematic view showing the light-emitting unit of the power control method generates the output power in the rewriting mode according to the preferred embodiment of the invention.

Referring to FIG. 11 and FIG. 12, with difference to the multi pulse mode, the optical disk drive 1 performs a rewriting mode on the optical storage media. In this mode, an erasing power ($P_e$) is set as the base power, and a bias power ($P_b$) and a writing power ($P_w$) are set as the reference power.

When the temperature of the light-emitting unit 111 is at temperature $T_1$, the DAC units 114-116 are controlled to generate the currents 25-27 as current $I_b$, $I_e-I_b$, and $I_w-I_e$. Thus, the light-emitting unit 111 is driven by the combinations of the currents 45-47 to generate different output powers (ex: $P_b$, $P_e$, and $P_w$). With difference to the multi pulse writing mode, the controller 12 change the power parameter as shown in the formulas (5) to (7) to compute the first current, the second current, and a third current.

$$I_{1\,(new)} = I_{req} \times \frac{P_b}{P_e} + I_{1\,(old)} \quad (5)$$

$$= \Delta I_2 \times \frac{P_b}{P_e} + \left((\Delta I_1 - I_t') \times \frac{P_b}{P_e} + I_t' + I_b\right) = I_b'$$

$$I_{2\,(new)} = I_{req} \times \frac{P_e - P_b}{P_e} + I_{2\,(old)} \quad (6)$$

$$= \Delta I_2 \times \frac{P_e - P_b}{P_e} + \left(\frac{(\Delta I_1' - I_t') \times}{\frac{P_e - P_b}{P_e}} + (I_e - I_b)\right)$$

$$= (\Delta I_1 + \Delta I_2 - I_t) \times \frac{P_e - P_b}{P_e} + (I_e - I_b) = I_e' - I_b'$$

$$I_{3\,(new)} = I_{req} \times \frac{P_w - P_e}{P_e} + I_{3\,(old)} \quad (7)$$

$$= \Delta I_2 \times \frac{P_w - P_e}{P_e} + \left(\frac{(\Delta I_1' - I_t') \times}{\frac{P_w - P_e}{P_e}} + (I_w - I_e)\right)$$

$$= (\Delta I_1 + \Delta I_2 - I_t) \times \frac{P_w - P_e}{P_e} + (I_w - I_e) = I_w' - I_e'$$

$I_{3(old)}$: the previous third current
$I_{3(new)}$: the update third current

Then the controller 12 generates the power control signal 23 again according to the third current ($I_w'-I_e'$), the second current ($I_e'-I_b'$) and the compensated first current ($I_b'$). The DAC units 114-116 receive the power control signal 23 and generate the currents 24 ($I_b'$), 25 ($I_e'-I_b'$) and 26 ($I_w'-I_e'$) to drive the light-emitting unit 111. Therefore the currents 24-26 drive the light-emitting unit 111 to generate the output power $P_b$, $P_e$, and $P_w$. In conclusion, when the temperature of the light-emitting unit 111 raise and control by the above method, the output power $P_{out}$ of the light-emitting unit 111 is controlled precisely at the bias power $P_b$, the erasing power $P_e$, and the writing power $P_w$ in the rewriting mode as shown in FIG. 12.

Figure 13:
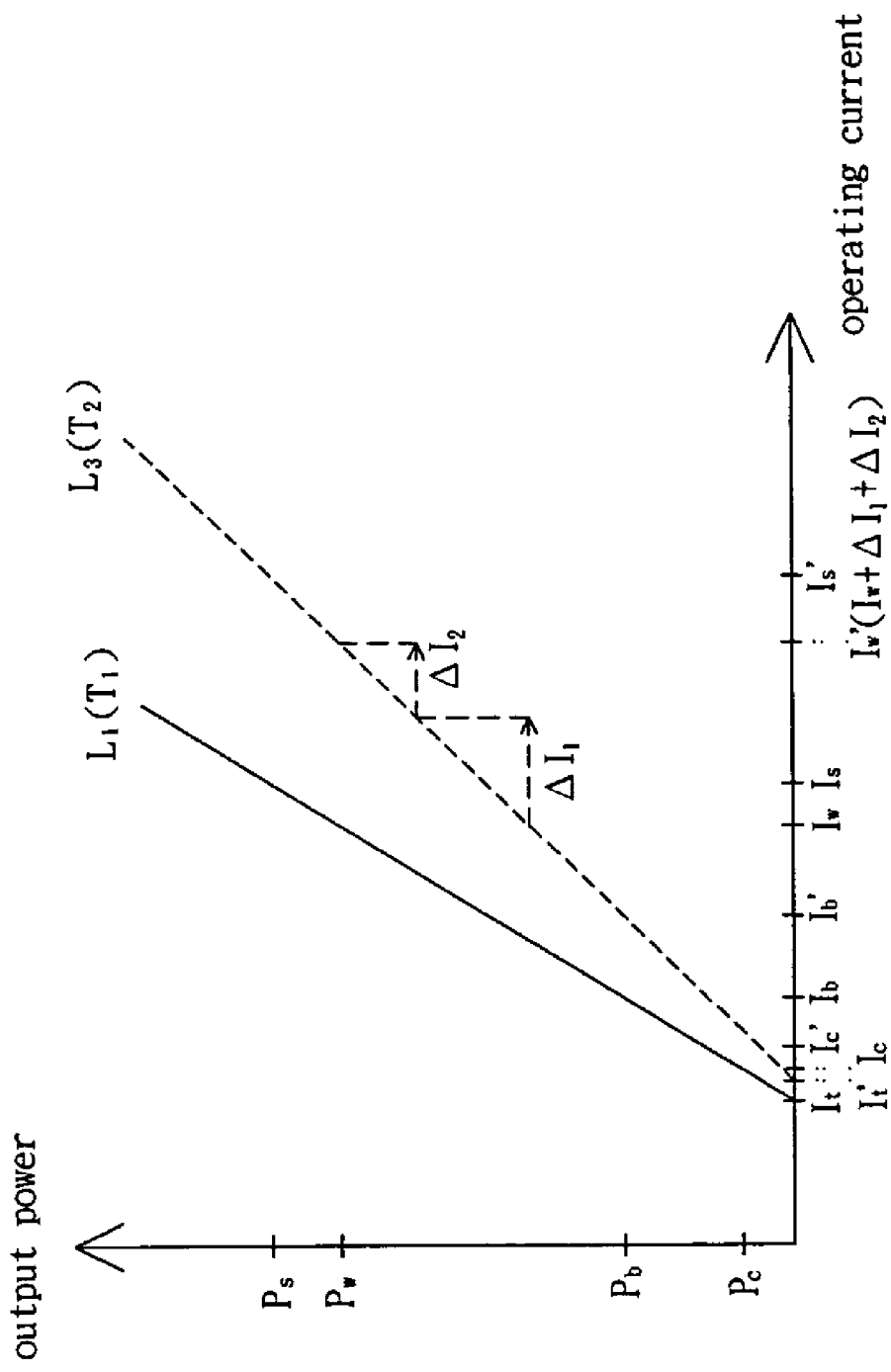
FIG. 13 is a curve relation diagram showing the light-emitting unit of the power control method generates the output power in the castle writing mode according to the preferred embodiment of the invention.
Figure 14:
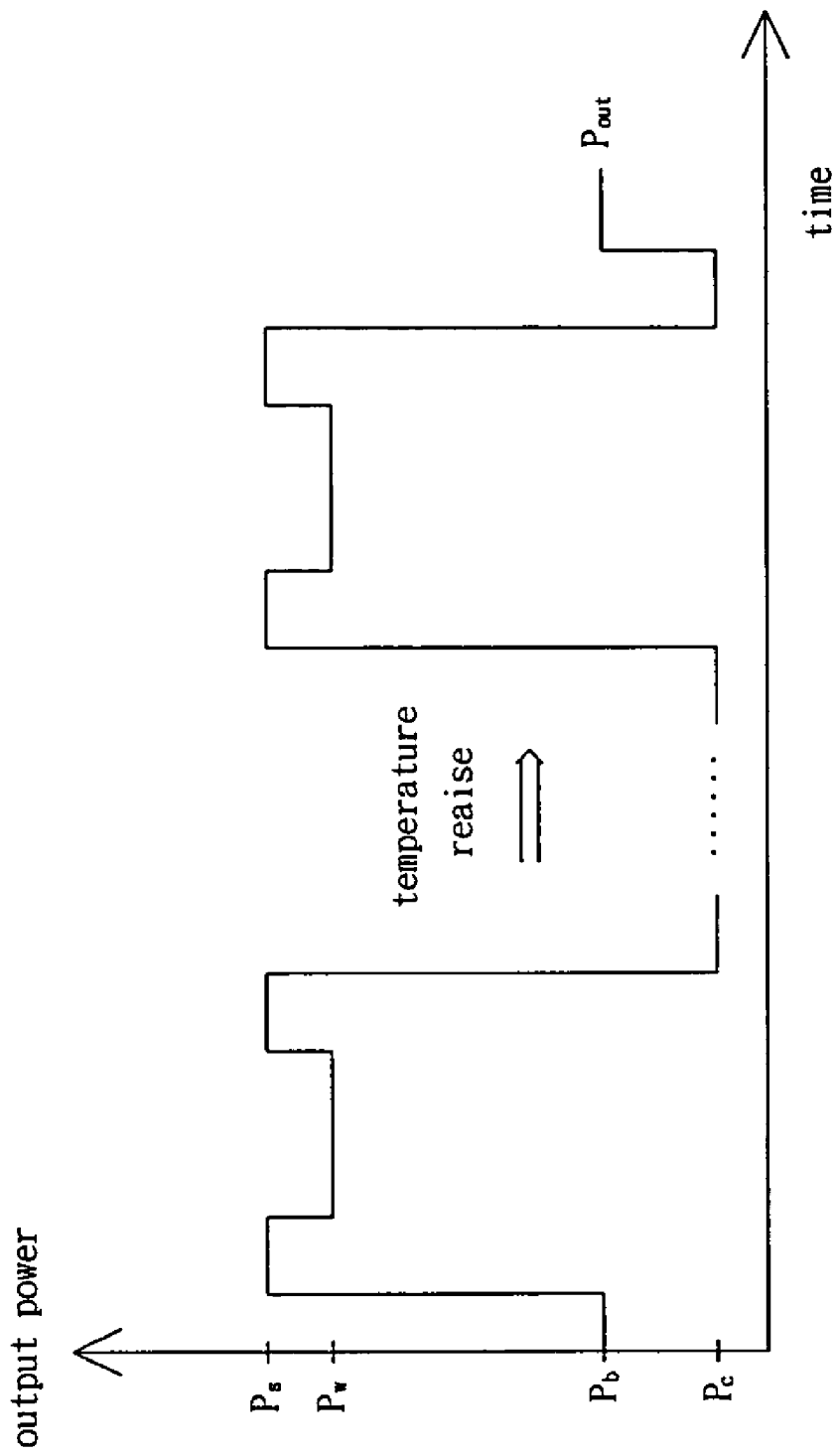
FIG. 14 is a schematic view showing the light-emitting unit of the power control method generates the output power in the castle writing mode according to the preferred embodiment of the invention.

Referring to FIG. 13 and FIG. 14, in block writing mode, a bias power ($P_b$) or a first writing power ($P_w$) is set as the base power, and a cooling power ($P_c$) or a second writing power ($P_s$) is set as the reference power.

Figure 15:
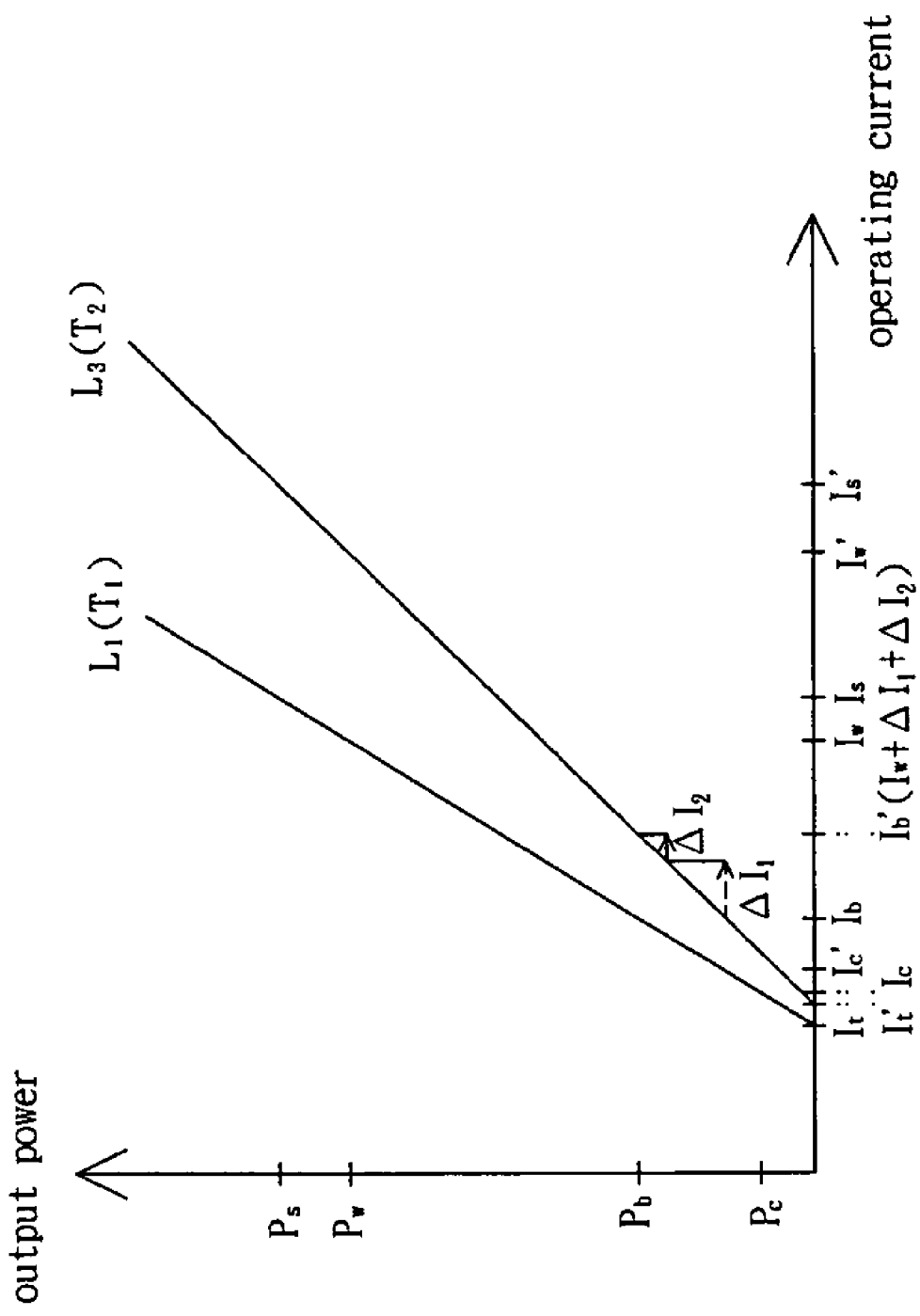
FIG. 15 is a curve relation diagram showing the light-emitting unit of the power control method generates the output power in the block writing mode according to the preferred embodiment of the invention.
Figure 16:
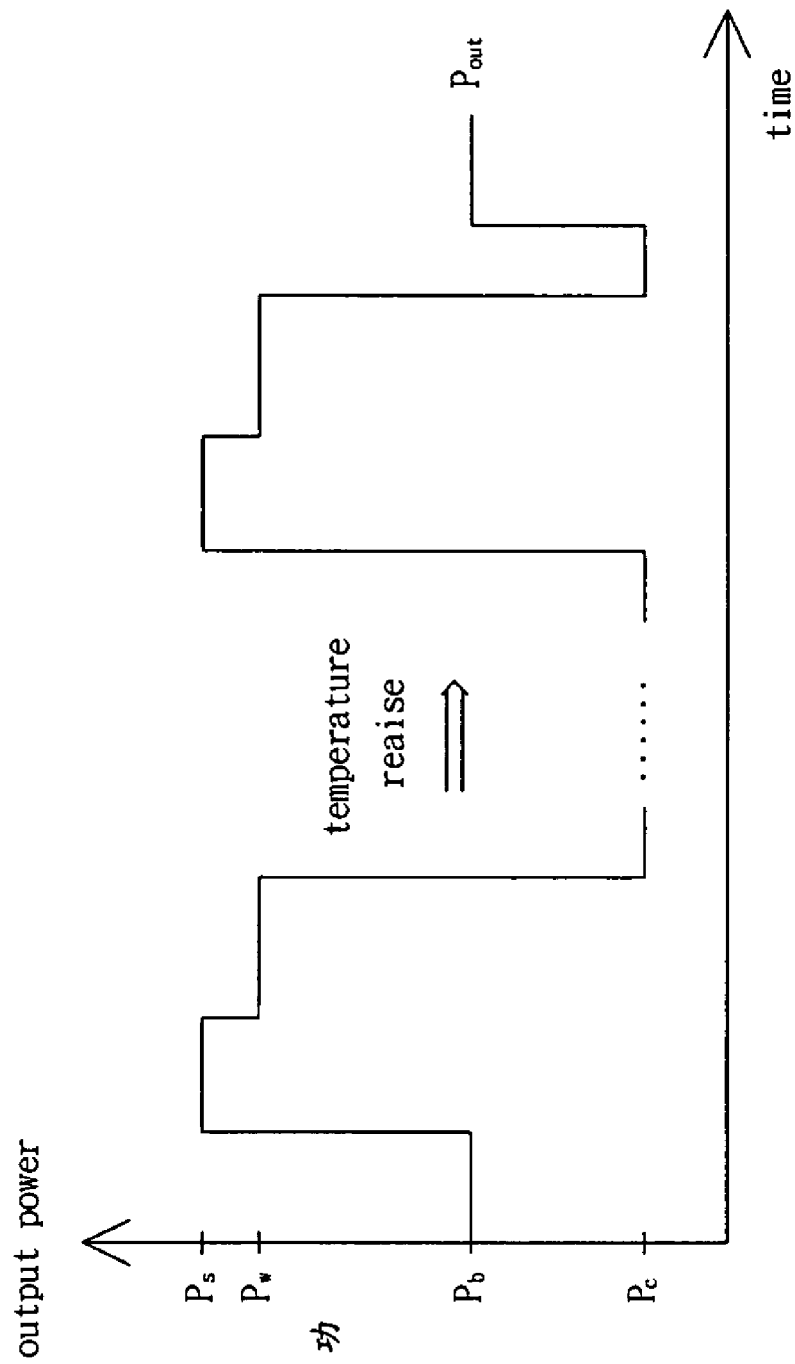
FIG. 16 is a schematic view showing the light-emitting unit of the power control method generates the output power in the block writing mode according to the preferred embodiment of the invention.

Referring to FIG. 15 and FIG. 16, in castle writing mode, a bias power ($P_b$) or a first writing power ($P_w$) is set as the base power, and a cooling power ($P_c$) or a second writing power ($P_s$) is set as the reference power. In the block writing mode and the castle writing mode, the controller 12 applied with the above power control method changes the power parameter to compute the first current, the second current, a third current, and a forth current.

Then the controller 12 generates the power control signal 23 again according to the forth current ($I_s'-I_w'$), the forth current ($I_w'-I_b'$), the second current ($I_b'-I_c'$) and the compensated first current ($I_c'$). The DAC units 114-117 receive the power control signal 23 and generate the currents 24 ($I_c'$), 25 ($I_b'-I_c'$), 26 ($I_w'-I_b'$) and 27 ($I_s'-I_w'$) to drive the light-emitting unit 111. Therefore the currents 24-27 drive the light-emitting unit 111 to generate the output power $P_c$, $P_b$, $P_w$, and $P_s$. In conclusion, when the temperature of the light-emitting unit 111 raise and control by the above method, the output power $P_{out}$ of the light-emitting unit 111 is controlled precisely at the cooling power $P_c$, the bias power $P_b$, the first writing power $P_w$, and the second writing power $P_s$ in the block writing mode (as shown in FIG. 14) and the block writing mode (as shown in FIG. 14).

Figure 17:
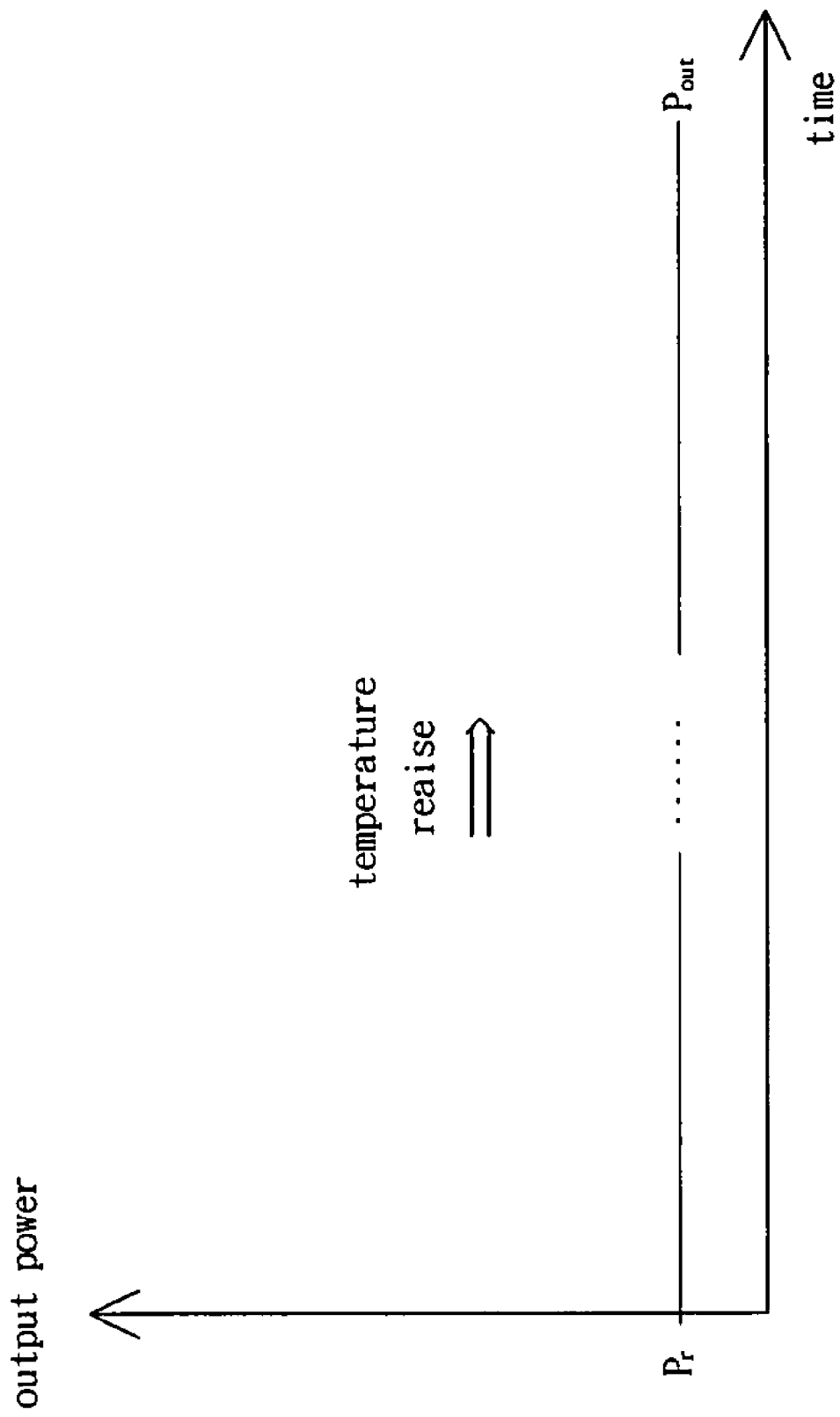
FIG. 17 is a schematic view showing the light-emitting unit of the power control method generates the output power in the reading mode according to the preferred embodiment of the invention.

Referring FIG. 17, in the reading mode, only a reading power ($P_r$) is applied and set as the base power. The controller 12 just controls the DAC unit 114 to generate current 24, and compensates the current 24 according to the temperature of the light-emitting unit 111. Therefore, the output power $P_{out}$ of the light-emitting unit 111 is precisely controlled at the reading power $P_r$.

In summary, the power control method of an optical disk drive of the invention computes an required current, which drives the optical read/write module to generate the distinct output power, according to a temperature of the optical read/write module. Thus, the method according to the invention is different from the conventional method that computes the required current for driving the optical read/write according to the power feedback signal. In addition, the power control method of an optical disk drive of the invention also computes the required current according to an accessing mode of the optical storage media. Therefore, the operating current of the optical read/write module is correctly controlled at different temperatures to generate the output power in distinct accessing mode.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A power control method for an optical disk drive, which has an optical read/write module for accessing an optical storage media, comprising:

measuring the temperature of the optical read/write module;

predicting a threshold current of the optical read/write module according to the temperature;

determining the accessing mode of the optical storage media;

measuring the output power of the optical read/write module and a base power in the accessing mode;

compensating the computed first current according to the predicted threshold current; and driving the optical read/write module according to the first current, wherein the optical read/write module starts to generate the output power when an operating current of the optical read/write module is larger than the threshold current of the optical read/write module, and the threshold current and the temperature of the optical read/write module are related in a function relationship.

2. The power control method as recited in claim 1, wherein the function relationship is an exponential function.

3. The power control method as recited in claim 1, wherein the predicting step comprises:

predicting the threshold current of the optical read/write module according to the temperature and the function relationship.

4. The power control method as recited in claim 1, wherein the accessing mode is reading mode, and a reading power in the reading mode is set as the base power.

5. The power control method as recited in claim 1, further comprising:
computing a second current required for the optical read/write module according to the output power of the optical read/write module and a reference power in the accessing mode.

6. The power control method as recited in claim 5, wherein the driving step comprises:
driving the optical read/write module according to the first current and the second current.

7. The power control method as recited in claim 5, wherein the accessing mode is rewriting mode, and an erasing power and a bias power in the rewriting mode are set as the base power and the reference power respectively.

8. The power control method as recited in claim 5, wherein the accessing mode is rewriting mode, and an erasing power and a writing power in the rewriting mode are set as the base power and the reference power respectively.

9. The power control method as recited in claim 5, wherein the accessing mode is multi pulse writing mode, and a bias power and a writing power in the multi pulse writing mode are set as the base power and the reference power respectively.

10. The power control method as recited in claim 5, wherein the accessing mode is block writing mode, and a bias power and a cooling power in the block writing mode are set as the base power and the reference power respectively.

11. The power control method as recited in claim 5, wherein the accessing mode is block writing mode, and a first writing power and a second writing power in the block writing mode are set as the base power and the reference power respectively.

12. The power control method as recited in claim 5, wherein the accessing mode is castle writing mode, and a bias power and a cooling power in the castle writing mode are set as the base power and the reference power respectively.

13. The power control method as recited in claim 5, wherein the accessing mode is castle writing mode, and a first writing power and a second writing power in the castle writing mode are set as the base power and the reference power respectively.

* * * * *